United States Patent
Alphonse

(10) Patent No.: US 6,175,446 B1
(45) Date of Patent: Jan. 16, 2001

(54) POLARIZATION-INDEPENDENT SEMICONDUCTOR OPTICAL AMPLIFIER

(75) Inventor: Gerard A. Alphonse, Princeton, NJ (US)

(73) Assignee: Sarnoff Corporation, Princeton, NJ (US)

(*) Notice: Under 35 U.S.C. 154(b), the term of this patent shall be extended for 0 days.

(21) Appl. No.: 09/159,141

(22) Filed: Sep. 23, 1998

Related U.S. Application Data

(60) Provisional application No. 60/089,631, filed on Jun. 16, 1998.

(51) Int. Cl.[7] .............................. H01S 03/00; H01S 03/10
(52) U.S. Cl. ............................................ 359/344; 372/27
(58) Field of Search .............................. 359/344; 372/50, 372/27

(56) References Cited

U.S. PATENT DOCUMENTS

| | | | |
|---|---|---|---|
| 4,713,821 | 12/1987 | Bradford et al. | 372/44 |
| 4,789,881 | 12/1988 | Alphonse | 357/17 |
| 4,793,679 | 12/1988 | Toda et al. | 350/96.15 |
| 4,821,276 | 4/1989 | Alphonse et al. | 372/45 |
| 4,821,277 | 4/1989 | Alphonse et al. | 372/45 |
| 4,856,014 | 8/1989 | Figueroa et al. | 372/46 |
| 4,941,738 | 7/1990 | Olsson | 350/377 |
| 4,952,017 | 8/1990 | Henry et al. | 350/96.15 |
| 4,958,355 | 9/1990 | Alphonse et al. | 372/45 |
| 5,151,818 | 9/1992 | Thijs et al. | 359/344 |
| 5,295,016 | 3/1994 | Van Deventer | 359/347 |
| 5,396,365 | 3/1995 | Gustavsson | 359/337 |
| 5,574,289 | * 11/1996 | Aoki et al. | 257/17 |
| 5,659,560 | * 8/1997 | Ouchi et al. | 372/27 |
| 5,793,511 | * 8/1998 | Bülow | 359/161 |
| 5,805,744 | * 9/1998 | Nakano et al. | 385/14 |
| 5,818,857 | 10/1998 | Palmer | 372/32 |
| 5,901,166 | * 5/1999 | Nitta et al. | 372/50 |
| 5,946,336 | * 8/1999 | Mizutani et al. | 372/50 |
| 6,026,107 | * 2/2000 | Huang | 372/50 |

OTHER PUBLICATIONS

Thijs et al., "Progress in Long–Wavelength Strained–Layer InGaAs(P) Quantum–Well Semiconductor Lasers and Amplifiers", *IEEE J. Quantum Electron.*, 1994, 30(2), 477–499.

* cited by examiner

*Primary Examiner*—Mark Hellner

(57) ABSTRACT

A semiconductor optical amplifier having various ratios of TE/TM polarization in a multiple quantum well structure on a substrate formed by growing a certain number of quantum wells under compressive strain and others under tensile strain, as well as buffers. The gain coefficients of the respective well layers are chosen such that the overall TE and TM gains are matched over the whole spontaneous emission spectrum so that the semiconductor optical amplifier is polarization-independent.

9 Claims, 3 Drawing Sheets

POLARIZATION-INDEPENDENT SEMICONDUCTOR OPTICAL AMPLIFIER

This application claims the benefit of U.S. provisional application No. 60/089,631, filed Jun. 16, 1998.

BACKGROUND OF THE INVENTION

1. Field of the Invention

The present invention relates to optical amplifiers, and more particularly, to a polarization-independent semiconductor optical amplifier obtained by growing on the same substrate two individually addressable angled-stripe strained layer structures with different TE-TM characteristics.

2. Description of the Prior Art

In optical communication systems, amplifiers are often used to boost or distribute optical signals in fibers. Because the fiber can support any optical polarization, it is desirable that the gain of the optical amplifier be polarization-independent. A major problem with such semiconductor optical amplifiers is an undesirable difference in optical gain for different polarizations. In other words, a semiconductor optical amplifier typically has a difference of several dB in gain between TE and TM (transverse electric and transverse magnetic) input waves. This can result in output distortion which impairs system performance. This is particularly important for analog signals for which the TE/TM gains are expected to be within a fraction of a dB.

It is well known that any optical polarization can be viewed as a linear combination of two independent polarizations, such as TE and TM waves, with a phase difference between them which may vary with time. Thus, an optical amplifier that has equal gain for the two independent polarizations will have equal gain for all polarizations.

It is also known that compressive strain in a quantum well active layer results in enhanced TE polarization, and that tensile strain results in enhanced TM polarization. These two gains have different spectral characteristics. Thus, without special care, the gain spectra of TE and TM are not the same over the full spectrum of a semiconductor optical amplifier.

FIGS. 1(a)–1(c) show the gain spectra for prior art multiquantum well structures of semiconductor lasers and amplifiers (MQW-SLAs) around 1300 nm. This data is taken from Thijs et al. in *IEEE J. Quant. Electron.*, Vol. 30, No. 2, pp. 477–498 (February 1994). FIG. 1(a) illustrates the polarization-resolved gain spectra at 100 mA drive current of a MQW-SLA with four compressively strained wells (4C) and two tensile strained wells (2T). Similarly, FIGS. 1(b) and 1(c) show the polarization-resolved gain spectra at 100 mA drive current of a MQW-SLA with four compressively strained wells (4C) and three tensile strained wells (3T) and four tensile strained wells (4T), respectively. FIG. 1(a) has two layers in tension and four layers in compression and shows TE to have about a 4 dB gain larger than TM. On the other hand, FIG. 1(c) has four layers in tension and four layers in compression and shows TM to be larger than TE by about 5 dB. In FIG. 1(b), for three layers in tension and four layers in compression, the TE and TM curves differ by about 2 dB. The wells in tensile strain (T) have 1% strain and a thickness of 110 Å, while the wells in compression (C) have 1% strain and a thickness of 45 Å. Such differences in gain for TE and TM are unacceptably large for current applications.

U.S. Pat. No. 5,151,818, entitled "Semiconductor Optical Amplifier" and issued to Thijs et al. describes a polarization-independent semiconductor optical amplifier that has two active layer portions in series. One portion is under tensile stress, and the other portion is under compressive stress. Polarization-independence is claimed to be achieved by adjusting the current through each portion. However, this is not satisfactory because the TE component of the signal is blocked by the TM section, and vice versa. This limits the amount of gain adjustment that can be realized. Moreover, as shown in FIG. 1(d), the TE and TM curves merely intersect at one point A, thus giving polarization-independent gain B at one wavelength C, not throughout a range of wavelengths. This intersection point is difficult to reproduce reliably and varies from device to device, limiting the usefulness of the device.

It is desired to combine the characteristics of compressive strain and tensile strain in quantum wells to create a semiconductor optical amplifier which is polarization-independent over a wide range of wavelengths. The present invention has been developed for this purpose.

SUMMARY OF THE INVENTION

The present invention is directed to an optical communication system including optical amplifiers for amplifying optical signals transmitted within the communication system. More particularly, the present invention relates to optical amplifiers used in optical communication systems, where the optical amplifier comprises a first conductivity type substrate and a structure comprising a first conductivity type first cladding layer, an active layer, and a second conductivity type cladding layer successively disposed on the substrate. The active layer has a first quantum well structure having a first number of quantum well layers under compressive strain and a second number of quantum well layers under tensile strain with a first buffer layer respectively therebetween and a second quantum well structure having a third number of quantum well layers under compressive strain and a fourth number of quantum well layers under tensile strain with a second buffer layer respectively therebetween. The first and second quantum well structures are disposed side-by-side on the first cladding layer and electrically separated and each has a TE gain and a TM gain. When a first current $I_1$ is applied to the first quantum well structure and a second current $I_2$ is applied to the second quantum well structure, the TE gain and the TM gain of the first and second quantum well structures are such that a total TE gain and a total TM gain of the optical amplifier are substantially equal over the full spontaneous emission spectrum so that the optical amplifier is polarization-independent. The amplified TE and TM components of the light output can be sampled and detected, and used in a feedback circuit to automatically equalize the two gains at all times and under any physical conditions.

BRIEF DESCRIPTION OF THE DRAWINGS

The present invention will be better understood after reading the following detailed description of the presently preferred embodiments thereof with reference to the appended drawings, in which.

DETAILED DESCRIPTION OF THE PREFERRED EMBODIMENTS

An optical amplifier which meets the above-mentioned objects and provides other beneficial features in accordance with the presently preferred exemplary embodiments of the invention will be described below with reference to FIGS. 2 through 4. Those skilled in the art will readily appreciate that the description given herein with respect to those figures is for explanatory purposes only and is not intended in any way to limit the scope of the invention.

In accordance with the present invention, at least two quantum well structures are grown on a substrate, over a cladding layer. Alternate lengths on the wafer are masked and one or more extra layers are selectively grown under either tensile or compressive strain, with a final buffer layer. After removal of the mask, cladding and capping layers are grown as in an ordinary structure. The relative number of layers in each section is chosen such that the TE and TM gains of each section are different so that the overall TE and TM gains are matched over the whole spontaneous emission spectrum by adjusting the applied currents so as to provide a polarization-independent semiconductor optical amplifier in accordance with the invention.

Figure 1A:
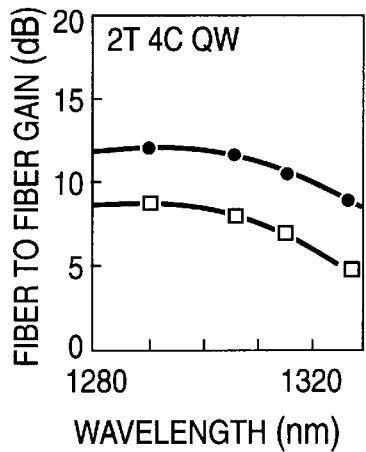
FIGS. 1(a)–1(c) illustrate the polarization-resolved gain spectra of a prior art MQW-SLA having four compressively (4C) strained wells and two (FIG. 1(a)), three (FIG. 1(b)), and four (FIG. 1(c)), tensile-strained wells (2T, 3T, and 4T), respectively.
Figure 1B:
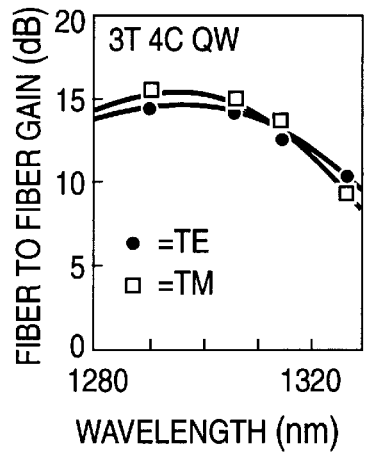
Figure 1C:
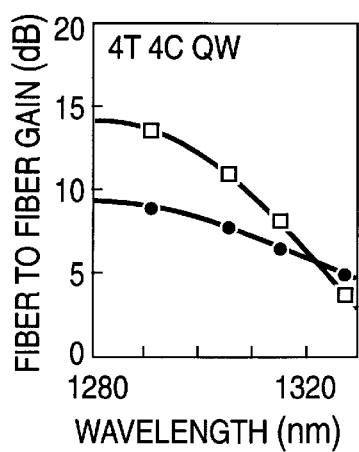
Figure 1D:
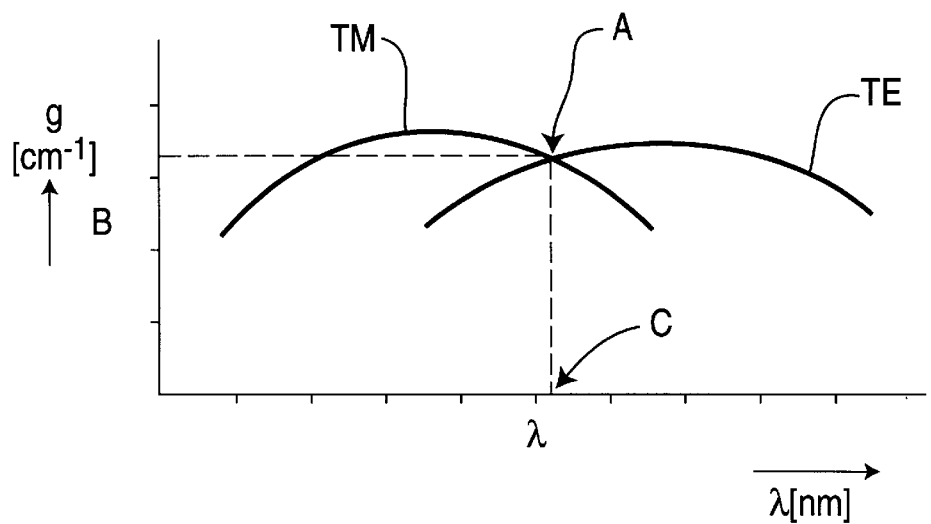
FIG. 1(d) shows TE and TM gain spectra for a prior art device.
Figure 2A:
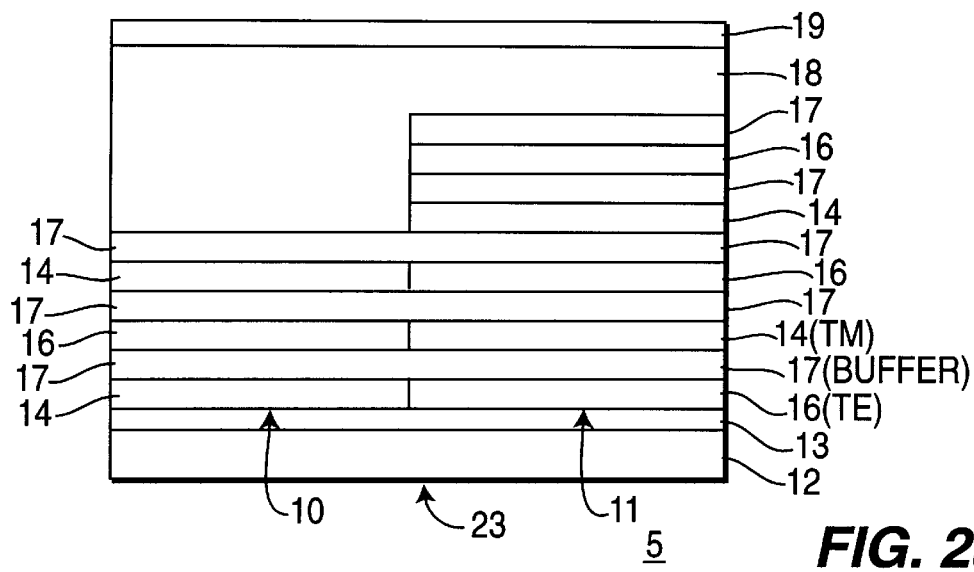
FIG. 2(a) illustrates an exemplary material layer structure for use in a semiconductor optical amplifier in accordance with the present invention.

FIG. 2(a) illustrates an exemplary polarization-independent semiconductor optical amplifier in accordance with the invention. In the semiconductor optical amplifier 5 of FIG. 2(a), two stacked structures 10, 11 are fabricated on the same substrate 12. A first cladding layer 13 is grown on the substrate 12 prior to fabrication of the two structures 10, 11. Each structure 10, 11 is grown to have a predetermined number of quantum well layers 14 under tensile strain and a number of quantum well layers 16 under compressive strain. A buffer 17 is grown between the quantum well layers. After the layers 14, 16, and 17 are grown as desired, a cladding layer 18 and a capping layer 19 are deposited over the entire device.

Figure 2B:
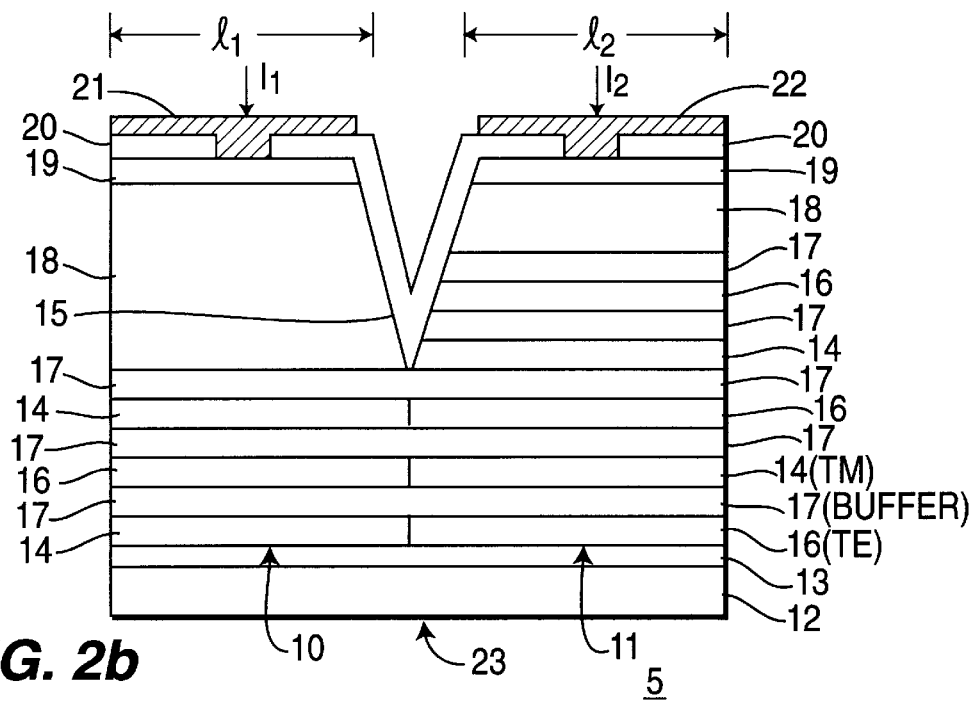
FIG. 2(b) illustrates an exemplary polarization-independent semiconductor optical amplifier in accordance with the present invention.

Electrical insulation between the two sections is provided by etching a groove or a notch 15 through the capping layer 19 and the cladding layer 18, as illustrated in FIG. 2(b). It is preferable to etch through the capping layer 19 and all of the cladding layer 18 to prevent current leakage between the two structures 10, 11. The device is completed by depositing a thin metallization layer 20 over the surface of the capping layer 19 and the notch 15. The metal layer 20 is etched away over the grooved area in accordance with the shape of the notch 15. Contact stripes are etched in the metal layer 20 and metal layers 21 and 22 are deposited over the metal layer 20 and in the holes to electrically contact the capping layer 19. By growing the two structures 10, 11 to have a particular ratio of quantum well layers 14 under tensile strain and quantum well layers 16 under compressive strain, a desired TE/TM polarization can be realized.

For example, the structure 10 in the optical amplifier 5 comprises two alternating quantum well layers of those under tensile strain 14 and those under compressive strain 16, with a buffer 17 between each quantum layer. Each of these layers has a length $l_1$. The structure 11 in the device comprises two alternating quantum well layers of those under compressive strain 16 and those under tensile strain 14, with an additional quantum well layer 16 under compressive strain on top of the stack, with a buffer 17 between each quantum layer. Each of these layers has a length $l_2$. A buffer layer 17 overlies each structure 10, 11. A cladding layer 18 and capping layer 19 are then grown over the entire device. The capping layer 19 over each of the structures 10, 11 and the substrate 12 is electrically connected to connection conductors in the shape of metal layers 21, 22, and 23, respectively, through which currents $I_1$ and $I_2$ can be supplied to the device.

Growth technologies such as MOCVD (metal organic chemical vapor deposition) or MBE (molecular beam epitaxy) can be used to fabricate the device. Photolithography and etching are used in the patterning of the device. Alternate lengths $l_1$ and $l_2$ on the wafer are masked on the structure using conventional techniques as the layers 14, 16, and 17 are grown. After the final quantum well layer or buffer is grown, the cladding layer 18 is grown or deposited. The capping layer 19 is then grown over the entire device. After the capping layer 19 is deposited, a notch 15, typically V-shaped because of the etching process, is etched in the cladding layer between the two structures 10, 11 to electrically isolate the two structures 10, 11 from each other. The subsequent metallization and etch steps, as described above, are performed in a conventional manner, as would be understood by those skilled in the art.

The device is typically composed of binary group III–V compounds such as GaAs or InP and alloys of such compounds. Devices for optical communications typically operate in the wavelength range of between about 1300 and 1600 nm. For this range, the device has a semiconductor body comprising a substrate 12 of a conductivity type (here n-type) and made of InP (doping, for example, approximately $5 \times 10^{18}$ at/cm$^3$) and layered structures situated thereon. A cladding layer 13 of the first conductivity type (here n-type) and made of $In_xGa_{1-x}As_yP_{1-y}$ is deposited on the substrate 12 and is preferably approximately 1 μm thick. The quantum layers under tensile strain 14 preferably comprise $In_xGa_{1-x}As$ and preferably have a thickness of approximately 10 nm. The quantum layers under compressive strain 16 preferably comprise $In_xGa_{1-x}As$ and preferably have a thickness of approximately 10 nm. The buffer layers 17 preferably comprise $In_xGa_{1-x}As_yP_{1-y}$ with a thickness of preferably approximately 10 nm. A cladding layer 18 of a second conductivity type (here p-type) and made of InP is deposited over and between the structures 11 and 12 and is approximately 1 μm thick. The notch 15 in the cladding layer 18 is preferably etched at least as deep as the top active layer in each structure 10, 11. The capping layer 19 is typically about 0.5 μm thick and typically comprises n or p-type InGaAsP. It should be noted that the values of x and y for the material compositions are appropriately determined in accordance with the desired wavelength of operation of the device.

Figure 2C:
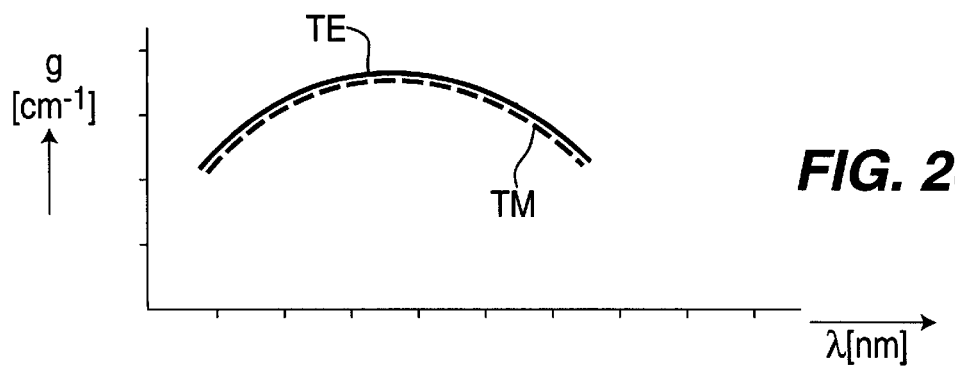
FIG. 2(c) shows TE and TM gain spectra for the device of FIG. 2(b).

During operation of the device 5, a current $I_1$ is supplied to the structure 10, and a current $I_2$ is supplied to the structure 11. By selecting the appropriate currents $I_1$ and $I_2$, the device 5 will be unpolarized throughout an entire range of wavelengths, as shown in FIG. 2(c). In other words, by selecting the appropriate currents $I_1$ and $I_2$, the TE curve and the TM curve for the device of the present invention can be made to substantially overlap throughout a wavelength range. Thus, even as the operating conditions such as temperature or device age change, the device can remain polarization-independent by the application of appropriate currents $I_1$ and $I_2$.

In accordance with the invention, the gain coefficients of the respective well layers are selected so as to provide a polarization-independent semiconductor optical amplifier. In particular, in the derivation below, it is shown that if the TE and TM gain coefficients of the two quantum well structures are such that $$\frac{g_1^{TE}}{g_1^{TM}} \neq \frac{g_2^{TE}}{g_2^{TM}}$$

(where $g_1$ and $g_2$ are the gains for the respective structures), then it is always possible to find currents $I_1$ and $I_2$ such that the overall TE and TM gains are equal over the whole spontaneous emission spectrum, as shown in FIG. 2(c). In other words, by adjusting the length and current of the quantum well structures, both structures can be made to have the same gain, thereby resulting in an unpolarized or polarization-independent amplifier.

Derivation

Let $G_1^{TE} = \exp[g_1^{TE} J_1 l_1]$, the single pass gain for TE mode in structure 10, and let $G_1^{TM} = \exp[g_1^{TM} J_1 l_1]$, the single pass gain for TM mode in structure 10, where:

g is the gain coefficient [m/A];

J is current density [A/m$^2$]; and l is the stripe length [m].

Similarly, let $G_2^{TE} = \exp[g_2^{TE} J_2 l_2]$, the single pass gain for TE mode in structure 11, and $G_2^{TM} = \exp[g_2^{TM} J_2 l_2]$, the single pass gain for TM mode in structure 11.

The total gain for each mode is the product $G_1 G_2$, i.e., $$G^{TE} = G_1^{TE} G_2^{TE} = \exp[g_1^{TE} J_1 l_1 + g_2^{TE} J_2 l_2]$$

and $$G^{TM} = G_1^{TM} G_2^{TM} = \exp[g_1^{TM} J_1 l_1 + g_2^{TM} J_2 l_2]$$

Because it is desired that $G^{TE} = G^{TM}$, let $\ln G^{TE} = \ln G^{TM} = A$, where "ln" means the natural logarithm. Then, the natural logarithm of the above gives the linear set of equations for $J_1$ and $J_2$:

$$g_1^{TE} l_1 J_1 + g_2^{TE} l_2 J_2 = A$$

$$g_1^{TM} l_1 J_1 + g_2^{TM} l_2 J_2 = A$$

This is of the form:

$$a_{11} J_1 + a_{12} J_2 = A_1$$

$$a_{21} J_1 + a_{22} J_2 = A_2$$

where $A_1 = A_2$.

The general solution is:

$$J_1 = A \frac{g_2^{TM} - g_2^{TE}}{(g_1^{TE} g_2^{TM} - g_1^{TM} g_2^{TE}) l_1};$$

-continued $$J_2 = A \frac{g_1^{TE} - g_1^{TM}}{(g_1^{TE} g_2^{TM} - g_1^{TM} g_2^{TE}) l_2}$$

The condition for $J_1$ and $J_2$ to exist is that the denominator not be equal to zero; i.e.,:

$$g_1^{TE} g_2^{TM} \neq g_1^{TM} g_2^{TE}$$

To meet this condition, it is sufficient to have:

$$g_2^{TM} > g_2^{TE}$$

$$g_1^{TE} > g_1^{TM}$$

i.e., that the two sections not be identical, then it is always possible to find currents $I_1$ and $I_2$ such that the overall TE and TM gains are equal over the whole spontaneous emission spectrum.

Figure 3:
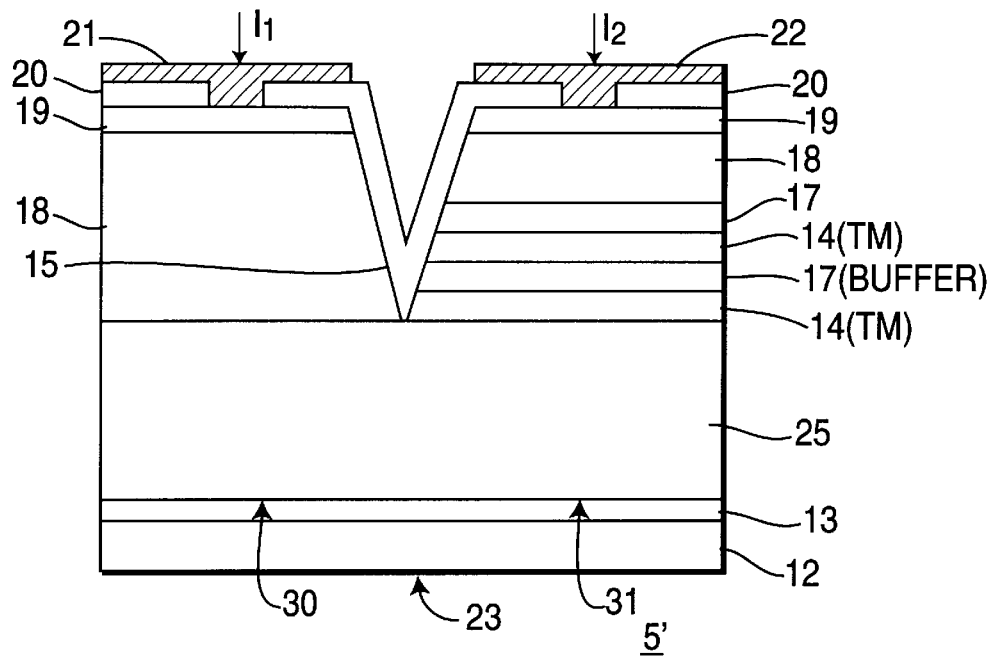
FIG. 3 illustrates an exemplary two-section polarization independent semiconductor optical amplifier having a first section which is 2T4C and a second section which is 4T4C in accordance with the present invention.
Figure 4:
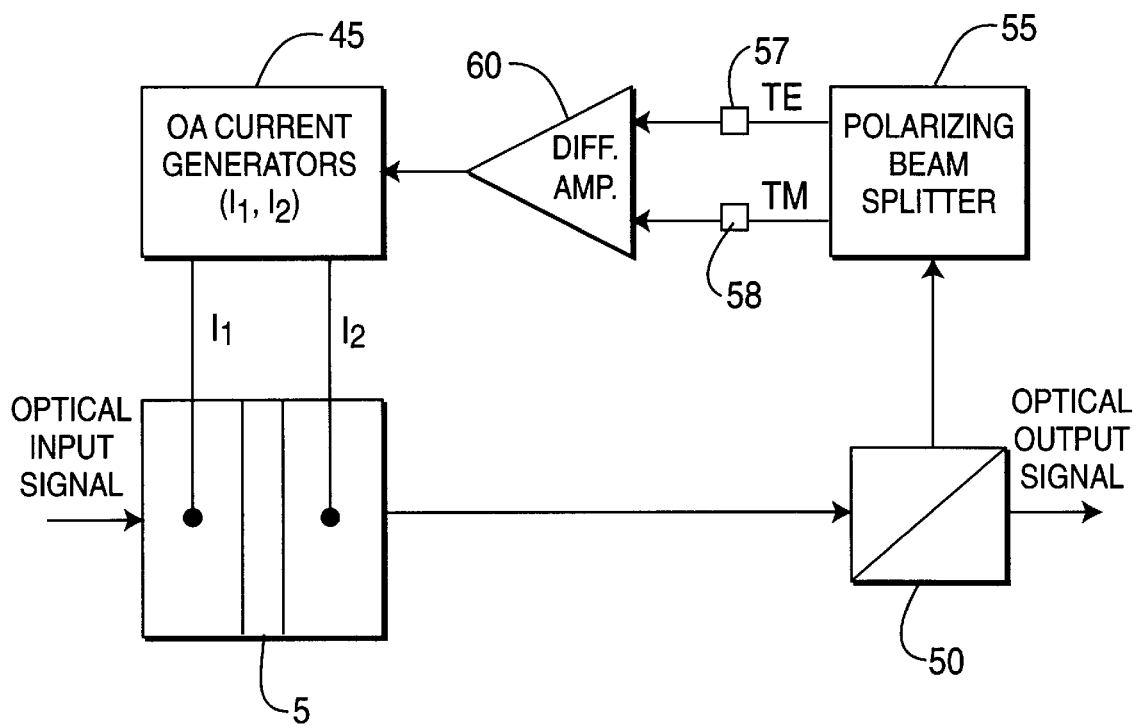
FIG. 4 is a block diagram of an exemplary system with automatic polarization control in accordance with the present invention.

An exemplary two-section polarization-independent semiconductor optical amplifier in accordance with the present invention is shown in FIG. 3. FIG. 3 contains elements similar to those described above with respect to FIGS. 2(a) and 2(b). These elements are labeled identically and their description is omitted for brevity. The semiconductor optical amplifier 5' comprises two structures 30, 31. Each of the structures 30, 31 has an identical set of layers 25 comprising two layers under tensile strain and four layers under compressive strain, with the layers separated by buffer layers. Hence they have higher TE gain than TM gain at this point. The structure 31 has two additional quantum well layers under tensile strain 14 separated by a buffer layer 17. The device is fabricated by growing the set of layers 25 for the two structures 30, 31 over the entire cladding layer 13. Photolithography and etching are then performed to separate the two structures. One region is then masked off and the additional layers 14 and 17 are grown to obtain the structure 31. Processing continues as described above with respect to FIG. 2(b). The additional layers 14 and 17 ensure that the TM gain in structure 31 is higher than the TE gain in structure 30 so that the overall TE and TM gains can be matched over the whole spontaneous emission spectrum by adjustment of the currents so as to provide the desired polarization-independent semiconductor optical amplifier. Because the set of layers 25 in the structures 30, 31 are grown during the same processing steps, the fabrication of the device is less complex and more efficient.

The order of growth of the layers under tensile strain 14 and the layers under compressive strain 16 does not affect the TE and TM gains in the structures. Only the number of layers and their thicknesses affect the TE and TM gains.

The device according to the present invention is physically much smaller than a rare-earth doped fiber amplifier (which is also polarization-independent) and less expensive. Moreover, a large gain adjustment can be achieved. Thus, a current can always be found to equalize the gains regardless of other operating conditions such as temperature and device age.

The balance between the TE and TM gains can be provided automatically. Part of the output of the optical amplifier of the present invention can be sampled and incorporated into a feedback system that detects the amount of amplification of the TE and TM polarized radiation and automatically adjusts the current that is delivered to the optical amplifier to equalize the two gains. In FIG. 4, a current generator 45 provides the separate currents to the different structures in the optical amplifier in accordance with the present invention, e.g., the optical amplifier 5 in FIG. 2(b). Thus, for example, the current generator 45 provides currents $I_1$ and $I_2$ to the structures 10, 11 in the optical amplifier 5. The output of the optical amplifier 5 is sampled by a beam splitter 50 to feed a polarizing prism or beam splitter 55 which separates the TE mode from the TM mode. The separate TE and TM modes are detected by detectors 57 and 58, respectively, and fed to a differential amplifier 60 which compares the amplification of the two modes and provides a feedback signal to the current generator 45. The feedback signal is used by the current generator 45 to adjust the current levels $I_1$ and $I_2$ so that the amplification levels will be the same for the TE and TM modes.

Although illustrated and described herein with reference to certain specific embodiments, the present invention is nevertheless not intended to be limited to the details shown. Rather, various modifications may be made in the details within the scope and range of equivalents of the claims and without departing from the invention. Thus, other semiconductor materials or other compositions of the chosen semiconductor materials than those mentioned in the examples may be used.

Also, the conductivity types may all be (simultaneously) replaced by their opposites. Apart from the manufacturing methods given here, variants to these methods are also available to those skilled in the art, while also other techniques, for example for providing the semiconductor layers, may advantageously be used.

Furthermore, the invention is not limited to the amplifier structure of the type described herein. Other types may be used as well. It should be noted that the invention may also be used for optical amplifiers in which no electrical connection conductors are used for supplying the current, but in which one or several radiation beams are used.

I claim:

1. An apparatus, comprising:
   (a) a first quantum-well structure on a substrate, said first quantum-well structure including:
      (i) at least one quantum well formed under compressive strain,
      (ii) at least one quantum well formed under tensile strain, and
      (iii) at least one buffer layer disposed between said at least one quantum well formed under compressive strain and said at least one quantum well formed under tensile strain; and
   (b) a second quantum-well structure on the substrate, said second quantum-well structure electrically separated from said first quantum well structure, said second quantum-well structure including:
      (i) at least one quantum well formed under compressive strain, and
      (ii) at least one quantum well formed under tensile strain, and
      (iii) at least one buffer layer disposed between said at least one quantum well formed under compressive strain and said at least one quantum well formed under tensile strain.

2. The apparatus of claim 1, further comprising:
   (c) a first cladding layer having a top edge and a bottom edge, and abutting said first quantum-well structure; and
   (d) a second cladding layer having a top edge and a bottom edge, and abutting said second quantum-well structure and next to said first cladding layer;
   and wherein said second quantum-well structure is electrically separated from said first quantum well structure by a space between said first cladding layer and said second cladding layer.

3. The apparatus of claim 2, wherein said first cladding layer is at least as thick as said second cladding layer, and wherein said space extends from the top edge of said first cladding layer to the bottom edge of said first cladding layer.

4. The apparatus of claim 1, further comprising:
   (a) a polarizing beam splitter operationally disposed in a light path with said first and second quantum-well structures to create a TE mode light path and a TM mode light path;
   (b) a first and second detector, said first detector provided in the TE mode light path downstream from said polarizing beam splitter, and said second detector provided in the TM mode light path downstream from said polarizing beam splitter;
   (c) a differential amplifier comprising two inputs, said first input operatively associated with said first detector, and said second input operatively associated with said second detector; and
   (d) a current generator operatively associated with the output from the differential amplifier, and operatively associated with said first quantum-well structure and said second quantum-well structure.

5. A feedback device, comprising:
   (a) a polarizing beam splitter operationally disposed in a light path with an optical amplifier to create a TE mode light path and a TM mode light path, the optical amplifier containing at least a first quantum-well structure and a second quantum-well structure;
   (b) a first and second detector, said first detector provided in the TE mode light path downstream from said polarizing beam splitter, and said second detector provided in the TM mode light path downstream from said polarizing beam splitter;
   (c) a differential amplifier comprising two inputs, said first input operatively associated with said first detector, and said second input operatively associated with said second detector; and
   (d) a current generator operatively associated with the output from the differential amplifier, and operatively associated with said optical amplifier to provide at least a first feedback current to the first quantum-well structure and a second feedback current to said second quantum-well structure.

6. A method for adjusting gain in light emitted from a multiple-quantum-well optical amplifier, at least one quantum well emitting light that is principally TE mode, and at least one quantum well emitting light that is principally TM mode, said method comprising:
   (a) separating emitted light that is principally TE mode from the emitted light that is principally TM mode;
   (b) comparing the TE mode light with the TM mode light;
   (c) sending to a generator, based on the comparison, a difference signal; and
   (d) generating a current for each quantum well so that the gain of the TE-mode light is substantially equal to the gain in the TM mode light.

7. The method of claim 6, wherein the multiple-quantum-well amplifier includes
   (a) a first quantum-well structure on a substrate, said first quantum-well structure including:
      (i) at least one quantum well formed under compressive strain,
      (ii) at least one quantum well formed under tensile strain, and (iii) at least one buffer layer disposed between said at least one quantum well formed under compressive strain and said at least one quantum well formed under tensile strain; and (b) a second quantum-well structure on the substrate, said second quantum-well structure electrically insulated from said first quantum well structure, said second quantum-well structure including:

(i) at least one quantum well formed under compressive strain, and (ii) at least one quantum well formed under tensile strain, and (iii) at least one buffer layer disposed between said at least one quantum well formed under under compressive strain and said at least one quantum well formed under tensile strain.

8. The method of claim 6, wherein said separating the emitted light step is performed by a polarizing beam splitter.

9. The method of claim 6, wherein said comparing the TE mode light with the TM mode light step includes the substeps of:

(i) converting the TE mode light to a first electrical signal;

(ii) converting the TM mode light to a second electrical signal; and (iii) receiving, by a differential amplifier, the first and second electrical signals.

* * * * *